US012791628B2

(12) United States Patent
Ryu et al.

(10) Patent No.: US 12,791,628 B2
(45) Date of Patent: Nov. 10, 2026

(54) APPARATUS FOR CHECKING FOR SHORT CIRCUITS

(71) Applicant: SK ON CO., LTD., Seoul (KR)

(72) Inventors: Jae Min Ryu, Daejeon (KR); Wook Kyoung Kim, Daejeon (KR); Sang Jun Park, Daejeon (KR); Kang San Kim, Daejeon (KR); Ji Eun Ahn, Daejeon (KR); Young Rae Oh, Daejeon (KR)

(73) Assignee: SK ON CO., LTD., Seoul (KR)

( * ) Notice: Subject to any disclaimer, the term of this patent is extended or adjusted under 35 U.S.C. 154(b) by 169 days.

(21) Appl. No.: 18/809,328

(22) Filed: Aug. 20, 2024

(65) Prior Publication Data

US 2025/0067816 A1 Feb. 27, 2025

(30) Foreign Application Priority Data

Aug. 21, 2023 (KR) ........................ 10-2023-0109231

(51) Int. Cl.
*G01R 31/52* (2020.01)
*H01M 10/42* (2006.01)

(52) U.S. Cl.
CPC ........ *G01R 31/52* (2020.01); *H01M 10/4285* (2013.01)

(58) Field of Classification Search
CPC .. G01R 31/52; G01R 31/3865; G01R 31/392; G01R 31/003; H01M 10/4285; H01M 10/48
See application file for complete search history.

(56) References Cited

U.S. PATENT DOCUMENTS

| | | | | |
|---|---|---|---|---|
| 9,701,056 | B2 | 7/2017 | Ochiai et al. | |
| 11,372,052 | B2 * | 6/2022 | Kim | G01R 31/3835 |
| 2003/0148175 | A1 * | 8/2003 | Iwanaga | H01M 10/0431 429/130 |
| 2012/0200981 | A1 * | 8/2012 | Zhang | H10P 72/722 361/234 |

(Continued)

FOREIGN PATENT DOCUMENTS

| | | | |
|---|---|---|---|
| CN | 211826396 | U | 10/2010 |
| CN | 214078706 | U | 8/2021 |

(Continued)

OTHER PUBLICATIONS

Extended European Search Report for European Patent Application No. 24195235.7 issued by the European Patent Office on Jun. 11, 2025.

(Continued)

*Primary Examiner* — Dominic E Hawkins
(74) *Attorney, Agent, or Firm* — IP&T GROUP LLP

(57) ABSTRACT

An apparatus is provided that checks for short circuits. The apparatus includes a support plate supporting the bottom surface of a center area of an electrode assembly, a pressurization unit that includes a first pressurization member pressurizing a top surface of the center area of the electrode assembly and a second pressurization member pressurizing opposite edge areas of the electrode assembly and a short circuit measurement unit applying voltage to the electrode assembly to check for a short circuit. The pressurization unit is configured to partially pressurize the entire upper and lower surfaces of the electrode assembly per an area.

14 Claims, 6 Drawing Sheets

(56) References Cited

U.S. PATENT DOCUMENTS

| | | | | |
|---|---|---|---|---|
| 2020/0400747 | A1* | 12/2020 | Min | G01R 31/36 |
| 2021/0190874 | A1* | 6/2021 | Kim | H01M 10/482 |
| 2022/0065948 | A1* | 3/2022 | Kim | H01M 10/4285 |

FOREIGN PATENT DOCUMENTS

| | | | | |
|---|---|---|---|---|
| DE | 29608009 | U1 | | 7/1996 |
| EP | 3719915 | A1 | | 10/2020 |
| JP | H07-171848 | A | | 7/1995 |
| JP | 2004006420 | A | * | 1/2004 |
| KR | 10-2015-0115358 | A | | 10/2015 |
| KR | 101736137 | B1 | | 5/2017 |
| KR | 10-2019-0006920 | A | | 1/2019 |
| KR | 10-2020-0077382 | A | | 6/2020 |
| KR | 10-2022-0118250 | A | | 8/2022 |
| KR | 102490082 | B1 | | 1/2023 |
| KR | 10-2023-0046593 | A | | 4/2023 |
| KR | 10-2023-0075796 | A | | 5/2023 |

OTHER PUBLICATIONS

Office Action for Korean Patent Application No. 10-2023-0109231 issued by the Korean Patent Office on Feb. 23, 2024.

* cited by examiner

APPARATUS FOR CHECKING FOR SHORT CIRCUITS

CROSS REFERENCE TO RELATED APPLICATION

The present application claims priority to Korean Patent Application No. 10-2023-0109231, filed Aug. 21, 2023, the entire contents of which is incorporated herein for all purposes by this reference.

BACKGROUND

1. Technical Field

Embodiments of the present disclosure relate to an apparatus for checking for a short circuit and, more particularly, to an apparatus for checking for short circuits for use in electrode assemblies.

2. Description of the Related Art

A secondary battery is a battery that can be repeatedly charged and discharged, and is applied as a power source having output characteristics and stability in eco-friendly electric vehicles, hybrid electric vehicles, energy storage systems (ESS), and the like.

Usually, the secondary battery may include an electrode assembly that includes a positive electrode plate coated with a positive active material, a negative electrode plate coated with an negative active material, and a separator, as well as a battery case (e.g., a pouch exterior material) for accommodating the electrode assembly and an electrolyte.

Before inserting the electrode assembly into the battery case, the electrode assembly is inspected for a short-circuit occurrence by connecting each probe to a positive electrode tab of the positive electrode plate and to a negative electrode tab of the negative electrode plate respectively, and then by applying a voltage. A short circuit occurs when a positive electrode and a negative electrode adjacent to a damaged area of the separator physically come into contact together and a leakage current is detected by a detector provided that the separator between the positive electrode plate and the negative electrode plate is damaged (e.g., folded, torn, punctured, etc.) when voltage is applied. When the leakage current diverges from the normal range, the electrode assembly is judged to be short-circuited.

In the process of sequentially stacking the positive electrode plate, the separator, and the negative electrode plate, it is difficult for a conventional short measurement device to detect pseudo-defects in the electrode assembly due to the thickness of the separator, the spacing between the separator and the electrode plate, and the mixture of foreign substances. In Korean Patent Application Publication No. 10-2022-0118250 a method is described that induces a temporary internal short circuit (short) of the positive electrode plate and the negative electrode plate by applying a surface pressure force to the electrode assembly and then by making the distance between the positive electrode plate and the negative electrode plates as close as possible by means of a pressurization plate. Such a countermeasure may provide the advantage of uniformly pressurizing the entire upper and lower surfaces of the electrode assembly to a predetermined pressure but it may inevitably have limitations in selectively performing partial pressurization on the electrode assembly or measuring electrode assemblies of various sizes.

SUMMARY

Embodiments of the present disclosure provide an apparatus for checking for a short circuit, the apparatus which determines whether an electrode assembly is short-circuited while pressurizing the electrode assembly.

In addition, an embodiment of present disclosure is configured to continuously determine whether the electrode assembly is short-circuited.

The apparatus for checking for short circuits according to an embodiment of the present disclosure includes a support plate that supports the bottom surface of a center area of an electrode assembly, a pressurization unit that includes a first pressurization member pressurizing a top surface of the center area of the electrode assembly and a second pressurization member pressurizing opposite edge areas of the electrode assembly and a short circuit measurement unit applying voltage to the electrode assembly to check for a short circuit, wherein the pressurization unit is configured to partially pressurize the entire upper and lower surfaces of the electrode assembly per an area.

In an embodiment of the present disclosure, the pressurization unit may be separated into first and second pressurization members and may be arranged spaced apart from each other.

In an embodiment of the present disclosure, the support plate may include an ejection pin arranged to move up and down.

In an embodiment of the present disclosure, the second pressurization member may include an upper pressurization block and a lower pressurization block arranged for reciprocating up and down with opposite edge areas of the electrode assembly placed therebetween.

In an embodiment of the present disclosure, the second pressurization member may be positioned at the same vertical line as the edge of the positive electrode plate to pressurize opposite edges of the positive electrode plate of the electrode assembly.

The apparatus for checking for short circuits according to another embodiment of the present disclosure includes a transfer unit configured to move a support plate on which the electrode assembly is mounted along a guide rail, a pressurization unit configured to pressurize the entire upper and lower surfaces of the electrode assembly, a short circuit measurement unit configured to determine whether there is a short circuit by applying voltage to the electrode assembly, and a mounting unit configured to position and arrange the pressurization unit along the length direction of the electrode assembly on the transfer unit.

An embodiment of the present disclosure may separate the electrode assembly into a center area and opposite edge areas that are symmetrically arranged along the length direction of the electrode assembly while being centered around the center area.

In another embodiment of the present disclosure, the support plate may be formed in the size and shape capable of supporting the center area of the electrode assembly.

In another embodiment of the present disclosure, the support plate may include an ejection pin on the top surface facing the center area of the electrode assembly.

In another embodiment of the present disclosure, the pressurization unit may include the first pressurization member for pressurizing the top surface of the center area of the electrode assembly and the second pressurization member for pressurizing opposite edge areas of the electrode assembly.

In another embodiment of the present disclosure, the pressurization unit may be separated into first and second pressurization members and may be arranged spaced apart from each other.

In another embodiment of the present disclosure, the second pressurization member may include an upper pressurization block and a lower pressurization block arranged for reciprocating up and down with opposite edge areas of the electrode assembly placed therebetween.

In another embodiment of the present disclosure, the mounting unit includes a horizontal frame extending orthogonally over the transfer unit, a vertical frame that is installed to be slidable in the length direction of the horizontal frame and is arranged to be coupled with the second pressurization member of the pressurization unit for moving up and down and a driving means that is arranged to be coupled with the horizontal frame in order to enable the first pressurization member of the pressurization unit to move up and down.

In another embodiment of the present disclosure, the short circuit measurement unit may be arranged in the second pressurization member to enable to move up and down a first probe and a second probe which contact with the positive electrode tab and the negative electrode tab of the electrode assembly and apply voltage.

In another embodiment of the present disclosure, the transfer unit may additionally include a clamping plate for clamping or unclamping the electrode assembly on the support plate.

The features and advantages of the embodiments of the present disclosure will become more apparent from the following detailed description based on the accompanying drawings.

It should be noted that the terms and words used in this specification and claims are not to be construed in their ordinary and dictionary sense, but are to be construed with a meaning and concept consistent with the technical idea of the present disclosure, based on the principle that inventors may define the concept of a term as they see fit to best describe their disclosure.

According to the above description of the embodiments of the present disclosure, the embodiments can reliably check for a short circuit on the electrode assembly while pressurizing the entire upper and lower surfaces of the electrode assembly.

In particular, an embodiment may partially pressurize the entire upper and lower surfaces of the electrode assembly per an area in order to more accurately identify the damaged part of the separator. Further, the embodiments may be universally applied to electrode assemblies of various standards through the above-described partial pressurization on the electrode assembly.

In addition, the embodiments of the present disclosure may provide the advantage of not only enabling total inspection but also shortening the measurement time by continuously performing short circuit measurements of the electrode assembly.

The embodiments of the present disclosure may reduce unnecessary additional labor and material losses by detecting abnormalities (e.g., short circuits) in advance in the electrode assembly before the process of packaging the electrode assembly in a battery case or activating it after packaging. These and other features and advantages of the invention will become apparent from the detailed description of embodiments of the present disclosure and the following figures.

DETAILED DESCRIPTION

Figure 1:
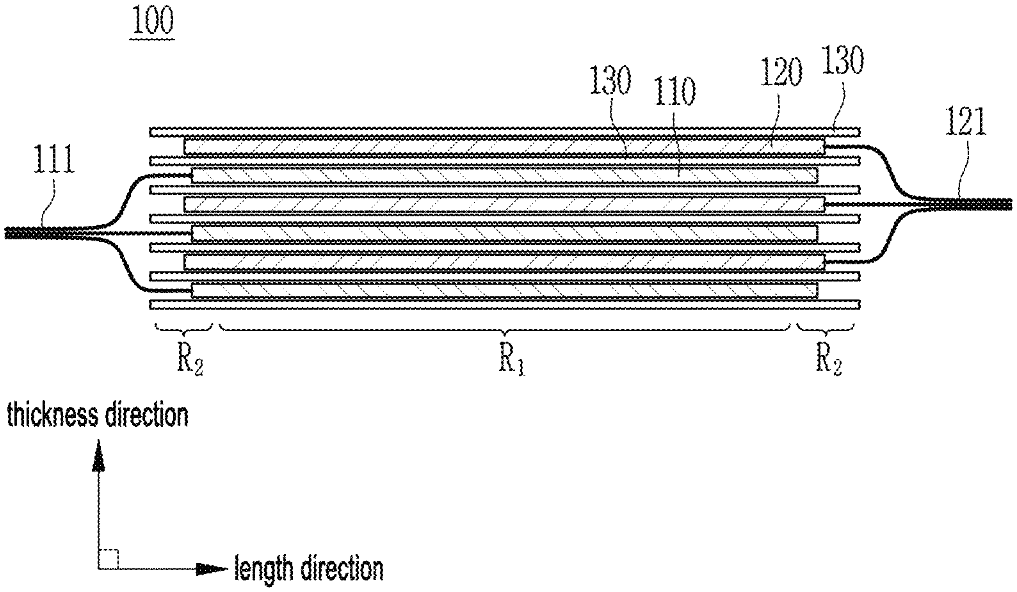
FIG. 1 is a simplified cross-sectional view schematic illustrating an electrode assembly.

The objectives, advantages, and features of the present disclosure will become more apparent from the following detailed description and various embodiments taken in conjunction with the accompanying drawings, but the present disclosure is not necessarily limited thereto. Additionally, in describing the embodiments, when it is determined that a detailed description of related known technology may unnecessarily obscure the gist of the present invention, the detailed description will be omitted.

The embodiments described in this disclosure and the accompanying drawings are not intended to limit the disclosure to specific embodiments. This disclosure is to be understood as including various modifications, equivalents, and/or alternatives of the embodiments.

In assigning reference numerals to components in the drawings, it should be noted that identical components are assigned the same reference numerals as much as possible even when they are shown in different drawings, and similar components are assigned similar reference numerals.

In this disclosure, terms such as first and second are used to distinguish one component from another component, and the components are not limited by the terms. In the accompanying drawings, some components are exaggerated, omitted, or schematically shown, and the size of each component does not entirely reflect the actual size.

Hereinafter, with reference to the accompanying drawings, an apparatus for checking for short circuits according to embodiments of the present disclosure will be described in detail.

The embodiments relate to an apparatus for checking for short circuits capable of detecting whether a short circuit occurs in an electrode assembly using a pressurization method. The apparatus may be preferably configured to check for a short circuit while pressurizing the entire upper and lower surfaces of the electrode assembly.

Further, the embodiments may detect whether an electrode assembly is short-circuited while guiding the electrode assembly to a subsequent process (e.g., an assembly process in which the electrode assembly is inserted into a battery case together with an electrolyte) after mounting the electrode assembly that includes a positive electrode plate, a negative electrode plate and a separator on the transfer unit.

As widely known to those skilled in the art, the electrode assembly 100 includes a plurality of positive electrode plates 110, a plurality of negative electrode plates 120, and a separator 130 inserted and placed for providing insulation between the positive electrode plates 110 and the negative electrode plates 120, as shown in FIG. 1. The electrode assembly 100 may be configured to place the separator 130 on the outermost layer, that is, the uppermost layer and the lowermost layer.

For reference, a positive electrode tab 111 may extend outward from the outer edge of the positive electrode plate 110, and a negative electrode tab 121 may extend outward from the outer edge of the negative electrode plate 120. As shown, the electrode assembly 100 may have the positive electrode tab 111 and the negative electrode tab 121 extending in opposite directions from each other from opposite edges of the length direction of the electrode assembly. Here, the length direction of the electrode assembly may mean the withdrawal direction of the electrode tabs 111, 121.

Referring to FIG. 1, it may be determined whether the electrode assembly is short-circuited by contacting a first probe and a second probe of the apparatus to check for short circuits, which will be described later, in a state where a plurality of positive electrode tabs and a plurality of negative electrode tabs protruding from the electrode assembly 100 are brought together and are overlapped with the same electrode. A plurality of positive electrode tabs and a plurality of negative electrode tabs bond in each bundle form through pre-welding to prevent separation in a state where the positive electrode tabs 111 and the negative electrode tabs 121 may be respectively gathered according to the same electrode, and a bundle of positive electrode tabs and a bundle of negative electrode tabs may contact the first probe and the second probe respectively. A check for short circuits may also be provided by welding a plurality of positive electrode tabs 111 to one electrode lead (not shown) and a plurality of negative electrode tabs 121 to the other electrode lead (not shown) via lead welding, and then by contacting the one electrode lead and the other electrode lead of the electrode assembly with the first and second probes respectively. For example, the separator 130 has a relatively larger size (e.g., area) than the positive electrode plate 110 and the negative electrode plate 120 to prevent the short circuit of the positive electrode plate 110 and the negative electrode plate 120.

It is known that the charge and discharge efficiency decreases due to the growth of lithium dendrites in secondary batteries, such as lithium secondary batteries. A desired level of battery performance effectiveness can be secured by using a large area of the negative electrode plate 120 to suppress the formation of such lithium dendrites. That is, the negative electrode plate 120 may be structured such that the area of the negative electrode plate 120 is relatively larger than the area of the positive electrode plate 110.

Figure 2:
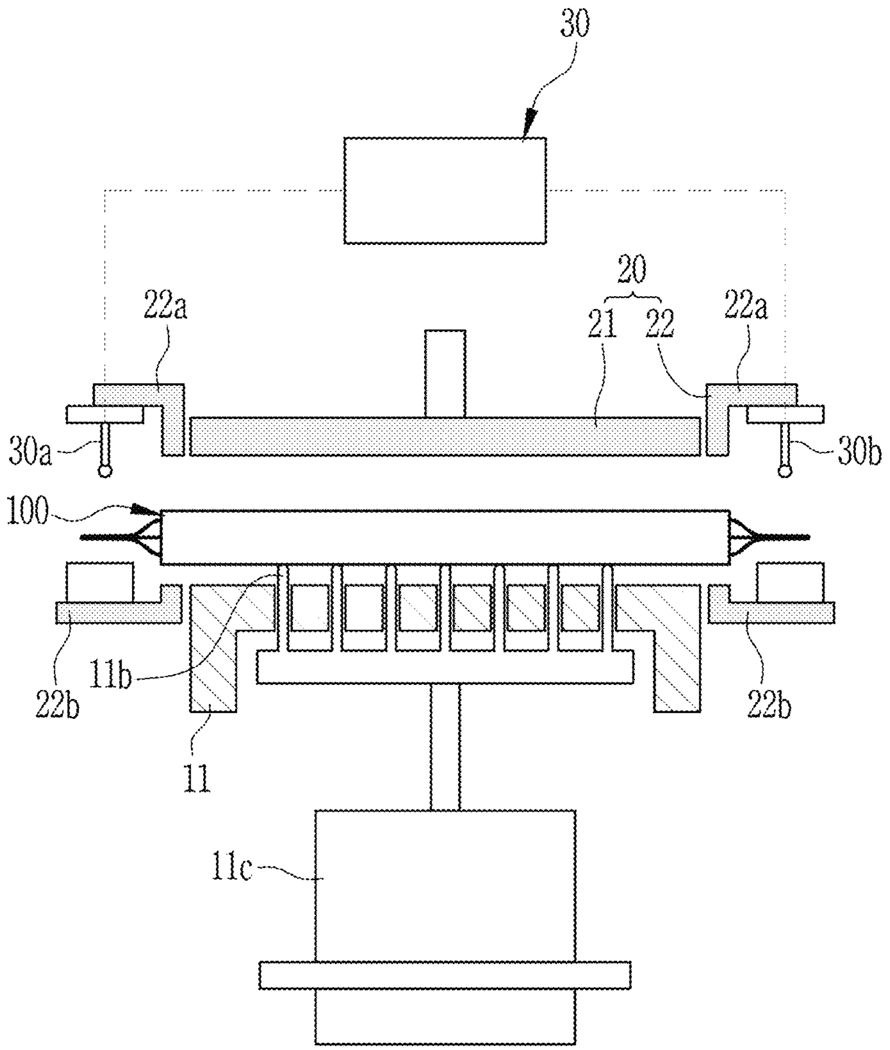
FIG. 2 is a simplified side cross-sectional view schematic illustrating a configuration of an apparatus for checking for short circuits according to an embodiment of the present disclosure.
Figure 3:
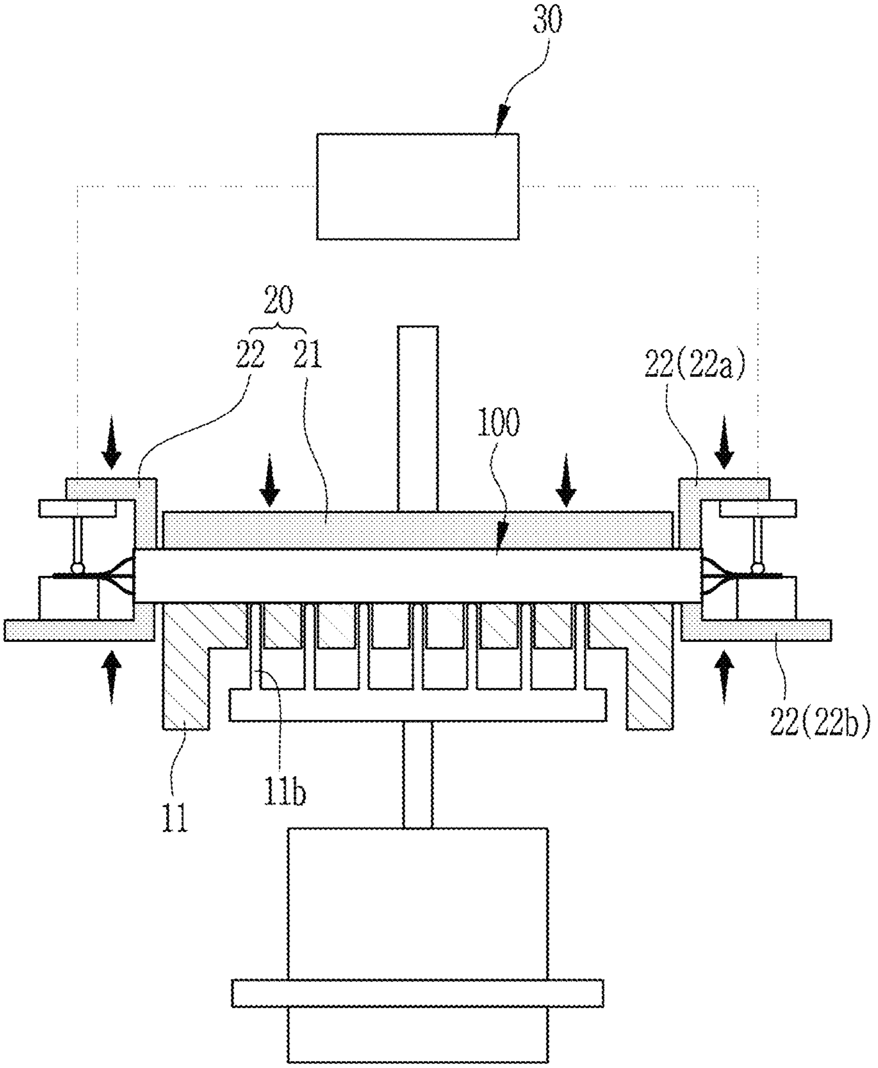
FIG. 3 is another simplified cross-sectional view schematic illustrating an operation of detecting short circuits of an electrode assembly of the apparatus for checking for short circuits of FIG. 2.
Figure 4:
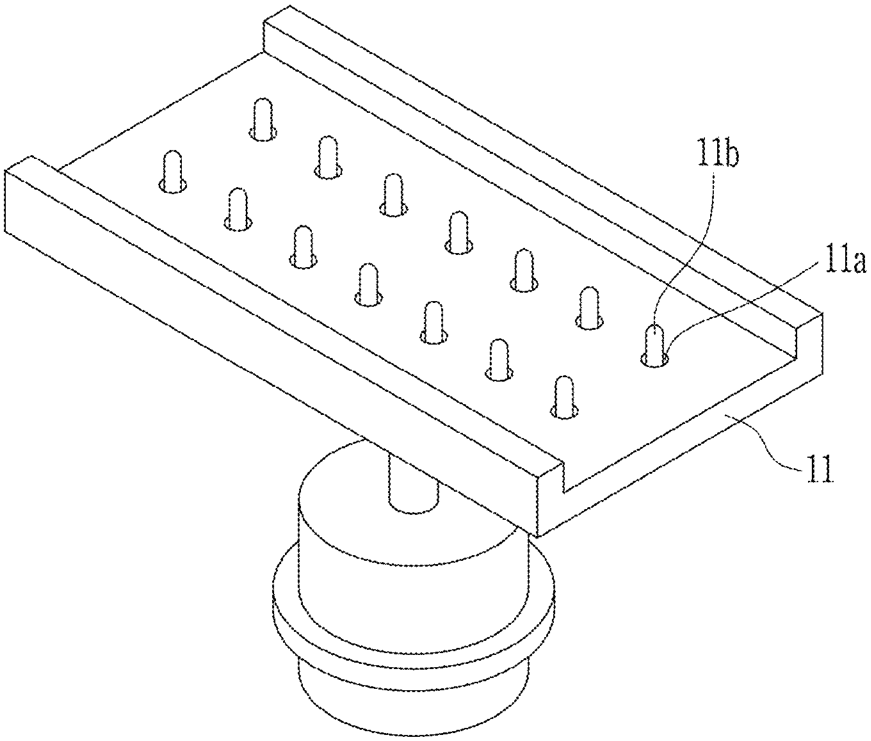
FIG. 4 is a simplified top perspective view schematic of a support plate applied to an apparatus for checking for short circuits according to an embodiment of the present disclosure.

Referring to FIGS. 2 to 4, the apparatus for checking for short circuits according to an embodiment of the present disclosure electrically connects a short circuit measurement unit 30 with the previously described electrode assembly 100.

The short circuit measurement unit 30 includes a power source (not shown) that applies voltage to the electrode assembly and a current measurement unit (not shown) that checks for leakage current, and is provided with the first probe 30*a* and the second probe 30*b* for applying a predetermined voltage from the power source to the electrode assembly 100. As shown, the short circuit measurement unit 30 is connected to the electrode assembly 100 by contacting the first probe 30*a* with the positive electrode tab 111 and by contacting the second probe 30*b* with the negative electrode tab 121. Thereby, the short circuit measurement unit 30 may detect the short circuit of the electrode assembly 100 by applying a predetermined voltage to the positive electrode tab 111 and the negative electrode tab 121 of the electrode assembly 100.

When a predetermined voltage is applied to the electrode assembly 100, an internal short circuit occurs and leakage current is detected in the damaged part of the separator 130 interposed between the positive electrode plate 110 and the negative electrode plate 120. Thus, the apparatus for checking for short circuits of the present disclosure may identify failures caused by defects of the separator when the measured leakage current exceeds the normal range.

the apparatus for checking for short circuits of the present disclosure may detect true defects (actual defects) in the short circuit measurement unit through leakage current as described above. In addition, the apparatus is configured to detect pseudo defects such as a gap between the separator 130 and the positive electrode plate (or the negative electrode plate), the pseudo defects which are not actual product defects.

To improve the detection power of not only true defects but also pseudo defects, an embodiment of the present disclosure has the feature of applying voltage while keeping the distance between the positive electrode plate, the separator, and the negative electrode plate as close as possible by applying surface pressure to the electrode assembly. That is, voltage is applied while pressurizing the electrode assembly which detects whether the electrode assembly has a short circuit by intentionally inducing a short circuit after physically contacting, the positive electrode plate and the negative electrode plate placed adjacent to the damaged part of the separator, to each other when the separator has a damaged part.

Preferably, the apparatus for checking for short circuits according to an embodiment of the present disclosure may check for a short circuit while pressurizing a top surface and a bottom surface in the thickness direction of an electrode assembly.

More preferably, the apparatus for checking for short circuits according to an embodiment of the present disclosure may partially pressurize the entire top surface and bottom surface of the electrode assembly for each area.

For this, the apparatus for checking for short circuits according to an embodiment of the present disclosure may include a support plate 11 that supports the electrode assembly 100, a pressurization unit that pressurizes the entire upper and lower surfaces of the electrode assembly 100, and a short circuit measurement unit 30 that detects an internal short circuit by applying voltage to the electrode assembly 100.

An embodiment of the present disclosure includes a support plate 11 for supporting the electrode assembly 100. The support plate 11 faces and supports one of the flat surfaces of the electrode assembly, for example, the undersurface of the electrode assembly 100.

As shown, the support plate 11 may be formed in a size and shape capable of supporting the center area R1 of the electrode assembly 100. That is, the support plate 11 is arranged to support not opposite edge areas R2 of the electrode assembly 100 but the center area R1. Here, the electrode assembly 100 is arranged to symmetrically extend opposite edge areas R2 along the length direction centering on the center area R1 of the electrode assembly 100. As shown in FIG. 1, opposite edge areas R2 refer to the areas adjacent to opposite edges of the positive electrode plate 110 facing the separator 130 and/or the negative electrode plate 120.

Accordingly, the support plate 11 may support the electrode assembly at a position that does not interfere with opposite edge areas R2 of the electrode assembly 100.

An embodiment includes a pressurization unit 20 that is configured to partially pressurize the entire upper and lower surfaces of the electrode assembly 100 by dividing them into areas. As shown, the entire upper and lower surfaces of the electrode assembly may be formed in a flat shape.

The pressurization unit 20 may be composed of the first pressurization member 21 and the second pressurization member 22 which may be separated into the first pressurization member 21 and the second pressurization member 22 that are spaced apart from each other. Optionally, an embodiment may configure the pressurization unit 20 to include a second pressurization member 22, a first pressurization member 21, the second pressurization member 22 sequentially arranged along the length direction of the electrode assembly 100.

The first pressurization member 21 may pressurize a part corresponding to the center area (R1; see FIG. 1) of the electrode assembly 100, and may be specifically positioned for reciprocating up and down over the support plate 11.

The second pressurization member 22 may pressurize a part corresponding to opposite edge areas (R2; see FIG. 1) of the electrode assembly 100 independently of the first pressurization member 21. Preferably the second pressurization member 22 may be provided at respectively opposite edges of the length direction of the electrode assembly 100.

Since damage to the separator generally occurs at the corners of the electrode assembly, the embodiment may effectively pressurize opposite edge areas of the electrode assembly where the possibility of damage to the separator is high, by means of the second pressurization member 22.

Furthermore, an advantage of reliably fixing the corners of the electrode assembly using the second pressurization member 22 to keep the alignment of the electrode assembly constant while checking for a short circuit is achieved. Specifically, the second pressurization member 22 is enabled to pressurize opposite edges of the positive electrode plate 110 which has a smaller area than the negative electrode plate 120 and the separator 130.

The second pressurization member 22 includes a pair of pressurization blocks arranged opposite each other with opposite edge areas of the electrode assembly in between, and is configured to include an upper pressurization block 22*a* reciprocating up and down above the top surface of opposite edge areas of the electrode assembly 100 and a lower pressurization block 22*b* reciprocating up and down below the bottom surface of opposite edge areas of the electrode assembly 100. The upper pressurization block 22*a* is configured to move upward to pressurize or downward to unpressurize opposite edge areas R2 of the electrode assembly 100 mounted on the support plate 11, and correspondingly the lower pressurization block 22*b* is configured to move upward to pressurize or downward to unpressurize opposite edge areas R2 of the electrode assembly 100 mounted on the support plate 11.

Furthermore, the second pressurization member 22 arranges the upper pressurization block 22*a* and the lower pressurization block 22*b* on the same vertical line in the thickness direction of the electrode assembly. Specifically, the second pressurization member 22 may be placed on the same vertical line as the edge of the positive electrode plate.

The first pressurization member, the upper pressurization block, and the lower pressurization block reciprocate up and down using a driving means (not shown). For reference, the driving means may be a hydraulic cylinder, a pneumatic cylinder, or a drive motor, and any configuration may be used when reciprocating up and down in the thickness direction orthogonal to the length direction of the electrode assembly.

Optionally, the first pressurization member 21 and the second pressurization member 22 may be provided with a buffer pad (not shown) on the pressurization part that interfaces with the electrode assembly. For example, the second pressurization member 22 may be provided with a buffer pad on the bottom surface of the upper pressurization block 22*a* and the top surface of the lower pressurization block 22*b*.

The buffer pad may prevent damage to the separator 130 in advance while pressurizing the electrode assembly 100 through the first pressurization member and second pressurization member.

An embodiment of the present disclosure may install a first probe 30*a* and a second probe 30*b* on an upper pressurization block 22*a* of the second pressurization member 22 to easily apply voltage while pressurizing opposite edge areas R2 of the electrode assembly 100 placed adjacent to the positive electrode tab 111 and/or the negative electrode tab 121 using the second pressurization member 22. The first probe 30*a* and the second probe 30*b* may be spaced apart from each other from the upper pressurization block 22*a* toward the outer front as shown.

In addition, the ejection pins 11*b* may be arranged to be capable of moving up and down on the support plate 11 so that the electrode assembly 100 may be easily separated from the support plate 11 after checking for short circuits. The support plate 11 includes a plurality of pinholes 11*a* perforated in the thickness direction on a top surface thereof, a plurality of ejection pins 11*b* respectively inserted through the plurality of pinholes 11*a* to move up and down, and a hoisting means 11*c* for hoisting the plurality of the ejection pins 11*b*.

To synchronize the ascending and descending movement of the plurality of ejection pins 11*b*, the plurality of ejection pins may be installed and fixed to the ejection plate (no reference numeral). The ejection plate is coupled to the hoisting means 11*c* and may move the plurality of ejection pins up and down according to driving of the hoisting means.

When the electrode assembly is released from the pressurization, the front end of the ejection pin protrudes from the upper surface of the support plate 11 so that the electrode assembly 100 may be separated from the support plate 11 whereas the ejection pins 11*b* may move backward into the pinholes 11*a* while checking for short circuits by pressurizing the electrode assembly using the pressurization unit. As a result, the electrode assembly may be supported with the ejection pins through the ascending movement of the ejection pins 11*b*, thereby allowing the electrode assembly to be quickly and reliably taken out into a subsequent process.

As shown in FIG. 4, a plurality of ejection pins 11*b* are spaced apart from each other in the inner area of the support plate 11, and thereby may support the electrode assembly evenly and horizontally. For example, a plurality of ejection pins 11*b* may be arranged in a grid-like pattern at uniform intervals on the top surface of the support plate 11.

Figure 5:
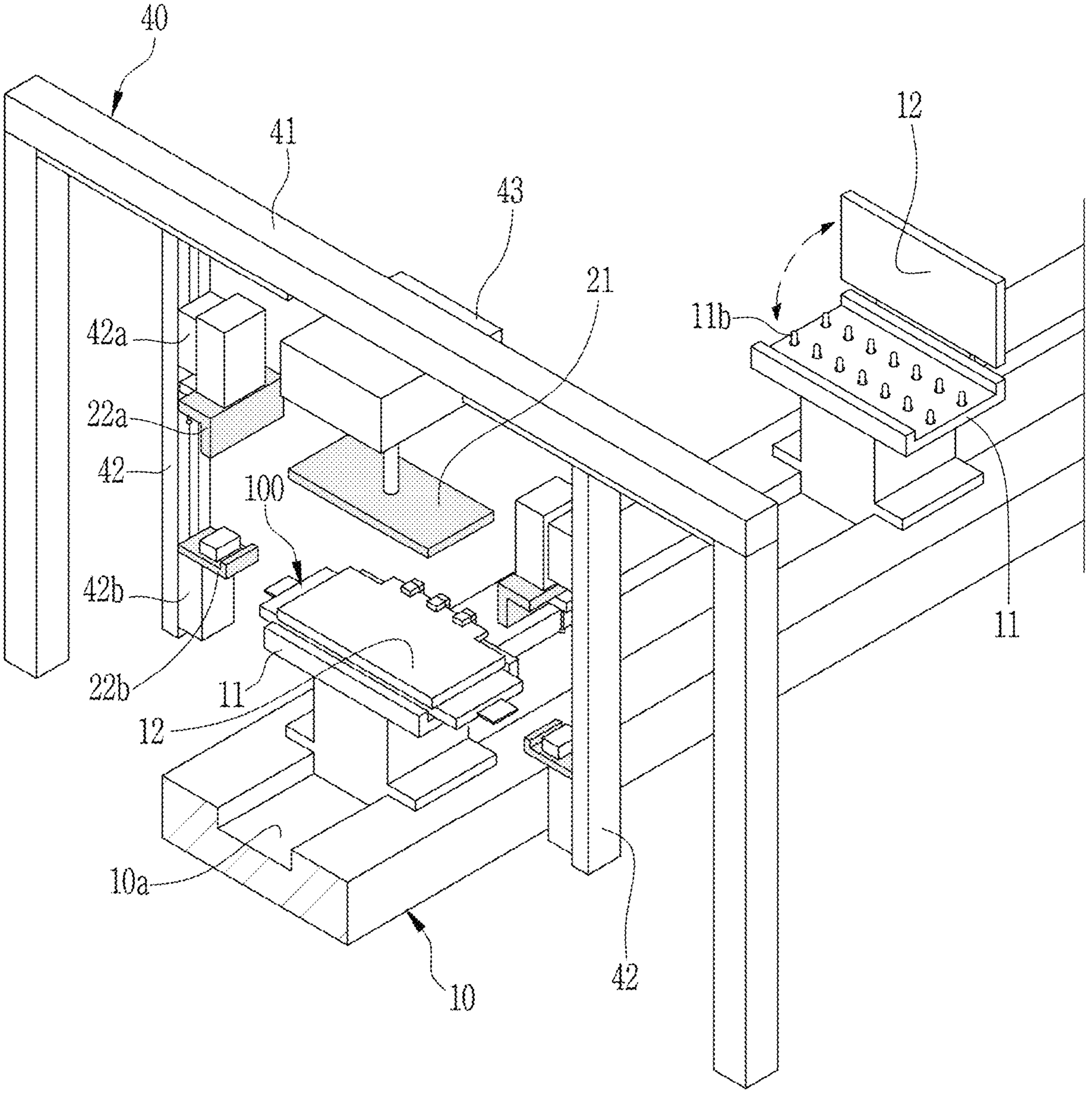
FIG. 5 is a view schematically illustrating a configuration of an apparatus for checking for short circuits according to another embodiment of the present disclosure.
Figure 6:
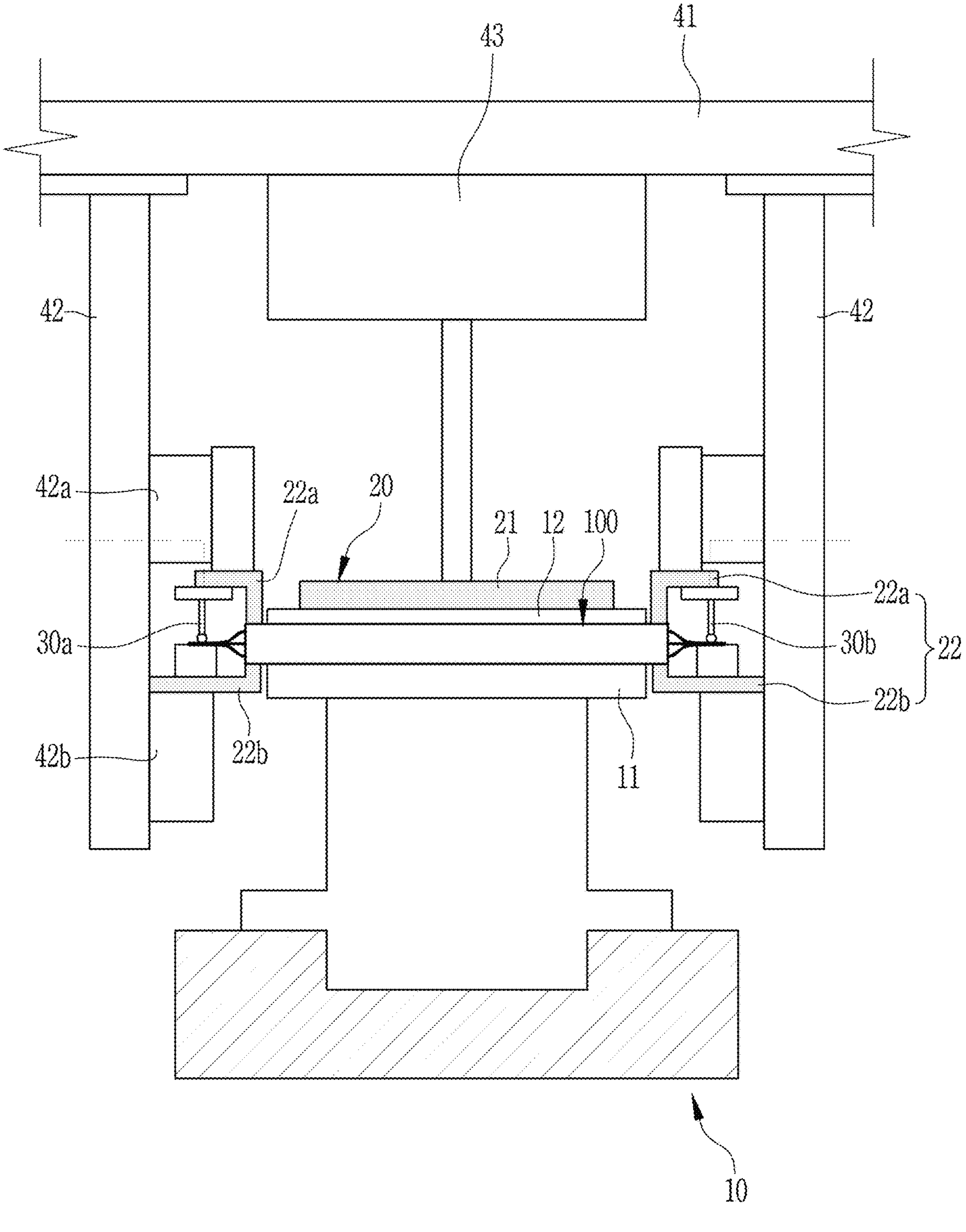
FIG. 6 is a simplified view schematic illustrating the process of detecting short circuits of an electrode assembly using an apparatus for checking for short circuits according to another embodiment of the present disclosure.

The apparatus for checking for short circuits according to another embodiment of the present disclosure is configured to continuously check for a short circuit of an electrode assembly and is configured to detect whether a short circuit occurs while sequentially transferring an electrode assembly to be measured as shown in FIGS. 5 to 6.

For reference, since the apparatus for checking for short circuits according to another embodiment of the present disclosure is similar to the above-described embodiment except for a transfer method of the electrode assembly and an installation method of the pressurization unit, a description of a similar or the same configuration will be excluded herein to help a clear understanding.

As shown, the apparatus for checking for short circuits according to another embodiment of the present disclosure includes a transfer unit 10 that sequentially transfers the electrode assembly 100 in a certain direction according to the process sequence, a pressurization unit 20 that pressurizes the entire upper and lower surfaces of the electrode assembly mounted on the transfer unit 10, a short circuit measurement unit 30 that detects an internal short circuit by applying voltage to the electrode assembly (see FIG. 2), and a mounting unit 40 that helps to select the position of the pressurization unit 20 to pressurize the entire upper and lower surfaces of the electrode assembly.

As described above, an embodiment of the present disclosure may be configured to enable the electrode assembly 100 to be mounted on the transfer unit 10 and to sequentially enter the pressurization unit 20.

Here, the transfer unit 10 may be a component member capable of linearly moving an object to be measured in the horizontal direction, and may include a guide rail 10*a* extending along the driving direction of the electrode assembly 100 and a support plate 11 driving along the guide rail. An embodiment of the present disclosure may position the electrode assembly 100 on the support plate 11 that may slide along the guide rail of the transfer unit 10, and then guide the electrode assembly 100 to be positioned at the pressurization unit 20.

Optionally, the transfer unit 10 may include a clamping plate 12 that clamps or unclamps the electrode assembly on the support plate 11.

The apparatus for checking for short circuits according to another embodiment of the present disclosure may position the electrode assembly in the pressurization unit 20 as shown in FIG. 5 by means of a transfer unit 10 moving with the mounted electrode assembly 100. Then, the apparatus may check for internal short circuits of the electrode assembly using the short circuit measurement unit 30 (see FIG. 2) and then guide to the next facility. Optionally the support plate 11 may be able to move at a constant speed in the extending direction of the guide rail.

As shown, the support plate 11 is formed in a size and shape capable of supporting the bottom surface of the center area R1 of the electrode assembly 100 and provides a space for installing the clamping plate 12. Corresponding to the support plate, the clamping plate 12 may be formed in a size and shape capable of covering the top surface of the center area of the electrode assembly 100.

Moreover, the support plate 11 is provided with a plurality of ejection pins 11*b* on the top surface facing the electrode assembly 100, more specifically, facing the center area R1 of the electrode assembly. The ejection pin 11*b* is provided to move up and down to separate the electrode assembly 100 from the support plate 11, which is described in detail with reference to FIG. 4.

As described above, an embodiment of the present disclosure includes a pressurization unit 20 that may selectively perform partial pressurization on the electrode assembly 100 or pressurize the entire upper and lower surfaces of electrode assembly 100 at a time while measuring a short circuit of the electrode assembly. The pressurization unit 20 includes the first pressurization member 21 that pressurizes the center area R1 of the electrode assembly 100 and the second pressurization member 22 that pressurizes opposite edge areas R2 of the electrode assembly 100 (see FIG. 1).

As shown, in another embodiment of the present disclosure, the first pressurization member 21 and the second pressurization member 22 may be positioned along the length direction of the electrode assembly by means of the mounting unit 40.

Specifically, the mounting unit 40 includes a horizontal frame 41 positioned over the transfer unit 10 that is configured to move with the mounted electrode assembly 100, a vertical frame 42 installed to slide in the length direction of the horizontal frame 41, and a drive means 43 coupled to the horizontal frame 41 to enable the first pressurization member 21 to reciprocate up and down. The horizontal frame 41 is arranged in a direction orthogonal to the driving direction of the electrode assembly, and may be arranged orthogonal to the transfer unit.

Additionally, an embodiment of the present disclosure may be configured to arrange the first pressurization member 21 to be on the same vertical line as the support plate 11 of the transfer unit 10.

The first pressurization member 21 is capable of pressurizing or depressurizing the electrode assembly downward and, more specifically, the center area R1 of the electrode assembly 100 using the drive means 43.

Upon pressurization of the first pressurization member, a surface pressure on the center area of the electrode assembly 100 is provided by pressurizing the clamping plate 12 covering the top surface of the center area of the electrode assembly using the first pressurization member 21. For this, the clamping plate 12 should be configured to clamp or unclamp the electrode assembly and at the same time be configured to move up and down by the pressurization of the first pressurization member in a state of covering the top surface of the center area of the electrode assembly.

Preferably, an embodiment of the present disclosure includes a first slider 42*a* and a second slider 42*b* that are coupled to move up and down along the length direction of the vertical frame 42. The second pressurization member 22 includes the upper pressurization block 22*a* and the lower pressurization block 22*b* arranged opposite to each other and the upper pressurization block 22*a* is coupled to the first slider 42*a* whereas the lower pressurization block 22*b* is coupled to the second slider 42*b*. The upper pressurization block 22*a* may move down or up to pressurize downward or depressurize the top surfaces of opposite edges of the electrode assembly 100 in dependence on (or urged by) the downward or upward movement of the first slider 42*a*. Corresponding to this, the lower pressurization block 22*b* can pressurize upward or depressurize the bottom surfaces of opposite edges of the electrode assembly 100 in dependence on the upward and downward movement of the second slider 42*b*.

As described before the first and second probes 30*a*, 30*b* may be positioned on the outer front side of the upper pressurization block 22*a* to apply voltage while pressurizing the electrode assembly. Accordingly, the first and second probes 30*a*, 30*b* may be arranged to move up and down in conjunction with the upward and downward movement of the upper pressurization block 22*a*.

As shown in FIG. 5, an embodiment of the present disclosure may allow the electrode assembly 100, (which is to be measured) to enter or exit between the upper and lower pressurization blocks 22*a* and 22*b* which are spaced apart from each other on the vertical frame 42.

As shown in FIG. 6, an embodiment of the present disclosure may reliably pressurize opposite edge areas R2 of the electrode assembly 100 by adjusting the distance between the upper pressurization block 22*a* and the lower pressurization block 22*b* on the vertical frame 42 in the direction of contact with each other. Through the descending movement of the upper pressurization block 22*a*, the first probe 30*a* and the second probe 30*b* may contact the positive electrode tab and the negative electrode tab of the electrode assembly 100 and then apply a predetermined voltage. Through this, the short circuit measurement unit 30 may be electrically connected to the electrode assembly 100 and then determine whether the electrode assembly is defective (for example, short circuits).

As shown, the vertical frame 42 along with the second pressurization member 22 may be arranged in a mirror symmetrical way centering on the drive means 43 in the horizontal frame 41. As a result, this helps to pressurize opposite edge areas R2 of the electrode assembly 100 using the second pressurization member 22.

As described above, the horizontal position of the second pressurization member 22 may change in the length direction of the electrode assembly 100 mounted on the support plate 11 because the vertical frame 42 having the second pressurization member 22 is installed to be slidable on the horizontal frame 41. By doing so, the opposite edge areas R2 of the electrode assembly are aligned between the upper pressurization block 22*a* and the lower pressurization block 22*b* of the second pressurization member 22 by changing the horizontal position of the second pressurization member 22 according to the size of the electrode assembly.

Various embodiments of the present disclosure have been described in detail. The embodiments are provided as implementation examples of the present invention, and are not intended to limit the scope of the present invention to these examples only. It will be clear that modifications and improvements can be made by those skilled in the art within the scope and according to the technical concepts of the present disclosure.

It should be understood that many modifications, changes and other embodiments may fall within the scope of the present invention as defined by the appended claims. Furthermore, the embodiments may be combined to from additional embodiments.

What is claimed is:

1. An apparatus for checking for short circuits, the apparatus comprising:

a support plate that supports a bottom surface of a center area of an electrode assembly;

a pressurization unit that includes a first pressurization member pressurizing a top surface of the center area of the electrode assembly and a second pressurization member pressurizing opposite edge areas of the electrode assembly; and a short circuit measurement unit applying a voltage to the electrode assembly to check for a short circuit of the assembly, wherein the second pressurization member comprises an upper pressurization block and a lower pressurization block arranged for reciprocating up and down at a location between opposite edge areas of the electrode assembly, wherein the pressurization unit partially pressurizes entire upper and lower surfaces of the electrode assembly for each area.

2. The apparatus for checking for short circuits of claim 1, wherein the pressurization unit is separated into first and second pressurization members that are spaced and arranged apart from each other.

3. The apparatus for checking for short circuits of claim 1, wherein the support plate comprises an ejection pin arranged to move up and down.

4. The apparatus for checking for short circuits of claim 1, wherein the second pressurization member is positioned at the same vertical line as an edge of a positive electrode plate of the electrode assembly in order to pressurize opposite edges of the positive electrode plate.

5. An apparatus for checking for short circuits, the apparatus comprising:

a transfer unit configured to move a support plate on which an electrode assembly is mounted, along a guide rail;

a pressurization unit that includes a first pressurization member pressurizing a top surface of the center area of the electrode assembly and a second pressurization member pressurizing opposite edge areas of the electrode assembly;

a short circuit measurement unit that determines whether there is a short circuit in the electrode assembly by applying a voltage to the electrode assembly; and a mounting unit for positioning and arranging the pressurization unit along a length direction of the electrode assembly on the transfer unit, wherein the second pressurization member comprises an upper pressurization block and a lower pressurization block arranged for reciprocating up and down at a location between opposite edge areas of the electrode assembly.

6. The apparatus for checking for short circuits of claim 5, wherein the electrode assembly is arranged to have a center area and opposite edge areas that are symmetrically arranged along the length direction of the electrode assembly while being centered around the center area.

7. The apparatus for checking for short circuits of claim 5, wherein the support plate is configured in a size and a shape capable of supporting a center area of the electrode assembly.

8. The apparatus for checking for short circuits of claim 5, wherein the support plate comprises an ejection pin on a top surface thereof facing a center area of the electrode assembly.

9. The apparatus for checking for short circuits of claim 5, wherein the first pressurization member and the second pressurization member are spaced and arranged apart from each other.

10. The apparatus for checking for short circuits of claim 5, wherein the mounting unit comprises:

a horizontal frame extending orthogonally over the transfer unit;

a vertical frame provided to be slidable in a length direction of the horizontal frame and arranged such that the second pressurization member of the pressurization unit is coupled with the vertical frame to move up and down; and a driving means provided in the horizontal frame to enable the first pressurization member of the pressurization unit to move up and down.

11. The apparatus for checking for short circuits of claim 5, wherein the short circuit measurement unit is arranged in the second pressurization member to enable a first probe and a second probe to move up and down which contact a positive electrode tab and a negative electrode tab of the electrode assembly and apply a voltage thereto.

12. The apparatus for checking for short circuits of claim 5, wherein the transfer unit further comprises a clamping plate for clamping or unclamping the electrode assembly on the support plate.

13. An apparatus for checking for a defect of a secondary battery by measuring a short circuit, the apparatus comprising:

a support holding an electrode assembly;

a first pressurization member configured to pressurize a center area of the electrode assembly of the secondary battery;

a second pressurization member configured to pressurize areas on opposite side edges of the electrode assembly, the second pressurization member comprising an upper pressurization block and a lower pressurization block arranged for reciprocating up and down at a location between opposite edge areas of the electrode assembly; and a short circuit measurement unit applying a voltage to the electrode assembly and checking for a short circuit of the electrode assembly by measuring a current resulting from the applied voltage, wherein an electrode tab extends out of the secondary battery pouch from each of said side edges.

14. The apparatus for checking for a defect of a secondary battery by measuring a short circuit of claim 13, wherein the support comprises a support plate and a clamping plate.

* * * * *